United States Patent
Fleming, Jr. et al.

(10) Patent No.: US 7,521,748 B2
(45) Date of Patent: Apr. 21, 2009

(54) METHOD TO ELIMINATE ARSENIC CONTAMINATION IN TRENCH CAPACITORS

(75) Inventors: Marshall J. Fleming, Jr., Underhill, VT (US); Mousa H. Ishaq, Essex Junction, VT (US); Steven M. Shank, Jericho, VT (US); Michael C. Triplett, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/875,503

(22) Filed: Oct. 19, 2007

(65) Prior Publication Data

US 2008/0035978 A1 Feb. 14, 2008

Related U.S. Application Data

(62) Division of application No. 11/276,024, filed on Feb. 10, 2006, now Pat. No. 7,294,554.

(51) Int. Cl.
*H01L 27/108* (2006.01)
(52) U.S. Cl. ............... 257/304; 257/301; 257/E27.092
(58) Field of Classification Search ............... 257/301, 257/304, E27.092
See application file for complete search history.

(56) References Cited

U.S. PATENT DOCUMENTS

| 4,372,033 | A | 2/1983 | Chiao |
| 6,326,261 | B1 | 12/2001 | Tsang et al. |
| 6,403,439 | B1 | 6/2002 | Lee |
| 6,437,381 | B1 * | 8/2002 | Gruening et al. ............ 257/296 |
| 6,501,117 | B1 * | 12/2002 | Radens et al. ............... 257/301 |
| 6,806,138 | B1 | 10/2004 | Cheng et al. |
| 2001/0016398 | A1 | 8/2001 | Kudelka et al. |
| 2002/0132423 | A1 | 9/2002 | Tsao |
| 2003/0094660 | A1 | 5/2003 | Crowder et al. |
| 2005/0003625 | A1 * | 1/2005 | Wang et al. .................. 438/387 |
| 2005/0090061 | A1 | 4/2005 | Rudeck et al. |
| 2005/0112839 | A1 | 5/2005 | Wu |
| 2005/0221556 | A1 | 10/2005 | Futatsugi et al. |
| 2007/0085125 | A1 * | 4/2007 | Inoue et al. .................. 257/301 |

* cited by examiner

*Primary Examiner*—Victor A Mandala
(74) *Attorney, Agent, or Firm*—Scully, Scott, Murphy & Presser, P.C.; Richard A. Kotulak, Esq.

(57) ABSTRACT

A trench capacitor structure in which arsenic contamination is substantially reduced and/or essentially eliminated from diffusing into a semiconductor substrate along sidewalls of a trench opening having a high aspect ratio is provided. The present invention also provides a method of fabricating such a trench capacitor structure as well as a method for detecting the arsenic contamination during the drive-in annealing step. The detection of arsenic for product running through the manufacturing lines uses the effect of arsenic enhanced oxidation. That is, the high temperature oxidation anneal used to drive arsenic into the semiconductor substrate is monitored for thickness. For large levels of arsenic outdiffusion, the oxidation rate will increase resulting in a thicker oxide layer. If such an event is detected, the product that has been through the process steps to form the buried plate up to the drive-in anneal, can be reworked to reduce arsenic contamination.

9 Claims, 12 Drawing Sheets

METHOD TO ELIMINATE ARSENIC CONTAMINATION IN TRENCH CAPACITORS

RELATED APPLICATION

This application is a divisional application of U.S. patent application Ser. No. 11/276,024, filed Feb. 10, 2006, now U.S. Pat. No. 7,294,554.

DESCRIPTION

1. Field of the Invention

The present invention relates to a semiconductor structure and a method of fabricating the same. More particularly, the present invention relates to a trench capacitor for use in a trench storage memory array, such as an embedded dynamic random access memory (eDRAM) array, in which arsenic contamination is substantially reduced or essentially eliminated from such structures. The present invention also relates to a method of substantially reducing or essentially eliminating arsenic contaminants from such semiconductor memory devices.

2. Background of the Invention

A metal oxide semiconductor field effect transistor (MOSFET) is used in forming dynamic random access memory (DRAM) cells. A DRAM circuit typically includes an array of memory cells interconnected by rows and columns, which are known as wordlines and bitlines, respectively. Reading data from, or writing data to, memory cells are achieved by activating selective wordlines and bitlines. Typically, a DRAM cell comprises a MOSFET connected to a capacitor. The capacitor includes two electrodes that are separated by a node dielectric, while the MOSFET includes a gate and diffusion regions that are referred to as either the source or drain region, depending on the operation of the transistor.

There are different types of MOSFETs known to those skilled in the art. A planar MOSFET is a transistor where a surface of the channel region of the transistor is generally parallel to the primary surface of the substrate. A vertical MOSFET is a transistor where a surface of the channel region of the transistor is perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Trench capacitors are frequently employed with DRAM cells. A trench capacitor is a three-dimensional structure formed into a semiconductor substrate. The structure is normally formed by etching trenches having a high aspect ratio (a depth to width ratio of greater than 3.0) into the substrate. Trench capacitors commonly have N+doped polysilicon or another conductive material as one electrode of the capacitor (i.e., the storage node) and the other electrode of the trench capacitor is a buried plate that is formed via outdiffusion of dopants, typically arsenic, into a portion of the substrate surrounding the lower portion of the trench.

The functionality of DRAM arrays that use deep trench storage nodes requires the electrical isolation of the plate side of the capacitor and the transfer device. This is accomplished using a parasitic npn transistor structure along the trench sidewall. Due to process variability during the formation of the outdiffused buried plate, arsenic residuals can contaminate the sidewalls of the deep trench.

The arsenic residuals, in turn, counter dope the array well disposed in the substrate after the drive-in anneal, and result in leakage of the plate charge to the transfer field effect transistor (FET) due to a lower threshold voltage of the parasitic device. This problem will cause fails in the writeback and signal margin tests of the cell and thereby reduce functionality and yield.

A typical prior art process of fabricating a portion of a trench capacitor structure is shown, for example, in FIGS. 1A-1H. Specifically, FIG. 1A shows an initial structure 10 that includes a semiconductor substrate 12 having at least one deep trench opening 14 located therein. The at least one deep trench opening 14 is formed by conventional lithography and etching. After etching and stripping of the photoresist mask, an arsenic doped silicate glass (ASG) layer 16 is conformally deposited on the horizontal surfaces of the substrate 12 and on exposed wall portions of the at least one deep trench opening 14.

Next, and as shown in FIG. 1B, a photoresist 18 is then deposited on the initial structure 10 shown in FIG. 1A. As is depicted in FIG. 1B, the photoresist 18 is located on the ASG layer 16. The resist layer 18 fills the at least one deep trench opening 14 and extends on the horizontal surface of the ASG layer 16 that is disposed above the upper surface of the substrate 12.

FIG. 1C shows the structure that is formed after the photoresist 18 is recessed into a lower portion of the at least one deep trench opening 14 utilizing an etching process that is selective to the photoresist material. Next, an etching process is performed to recess the ASG layer 16. Under ideal circumstances, this etching process is intended to completely remove the ASG layer 16 within the at least one deep trench opening 14 that is not protected by the recessed photoresist 18. However, as shown in FIG. 1D, this step within the prior art process leaves residual ASG 16' on the exposed sidewalls of the substrate 12 within the at least one deep trench opening 14. The residual ASG layer 16' is typically tapered outward from the upper surface of the substrate 12 at the mouth of the at least one deep trench opening 14 and extending down the sidewalls of the at least one trench opening 14. As such, the residual ASG layer 16' becomes thicker as its depth within the at least one deep trench opening 14 increases, Next, a dielectric cap 20 such as an oxide is formed providing the structure that is illustrated in FIG. 1E. As shown, the dielectric cap 20 is located within the at least one deep trench opening 14 and atop the horizontal surface of the substrate 12 that extends from the mouth of the at least one deep trench opening 14. An annealing step which drives-in As is then performed providing the structure shown in FIG. 1F. As illustrated, the anneal step forms the n-type buried plate 22 along an exterior bottom portion of the at least one deep trench opening 14. Additionally, and due to the presence of the residual ASG layer 16' remaining within the at least one deep trench opening 14, an As doped region 24 is formed within the substrate 12 along the exterior sidewalls of the at least one deep trench opening 14. As shown, this As doped region 24 is in contact with the buried plate 22 and it extends vertically to the surface of the substrate 12.

FIG. 1G illustrates the structure of FIG. 1F after removing the dielectric cap 20 and stripping of the ASG layer 16 including the residual ASG layer 16' from within the at least one deep trench opening 14. As shown, a portion of a p-well 13 along the exterior sidewalls of the at least one deep trench opening 14 is counter doped by the As doped region 24. FIG. 1H shows the structure of FIG. 1O after formation of a collar 26 and n-type diffusion regions 28.

As stated above, the presence of the arsenic residuals counter dopes the array well after the drive-in anneal, and results in leakage of the plate charge to the transfer field effect transistor (FET) due to a lower threshold voltage of the parasitic device. This problem will cause fails in the writeback and signal margin tests of the cell and thereby reduce functionality and yield.

In view of the arsenic contamination problem mentioned in prior art trench capacitor structures, there is a need for providing a trench capacitor structure in which such arsenic contamination is substantially reduced or essentially eliminated.

SUMMARY OF THE INVENTION

The prior art process of fabricating the storage node buried plate consists of depositing an arsenic-containing film into the sidewalls of a trench opening formed into a semiconductor substrate, and stripping the arsenic-containing film, after arsenic has been diffused into the substrate by an annealing step. Due to variability in the arsenic concentration of the film, the film thickness, the efficiency of cleaning process to remove arsenic from the trench sidewalls, and the efficiency of the capping layer to prevent arsenic outdiffusion during the annealing step, a high enough concentration of arsenic (on the order of about $2 \times 10^{17}$ atoms/cm$^3$ or greater) can form in the array well which may affect device functionality.

The present invention describes the detection and subsequent method to substantially reduce or essentially eliminate arsenic contamination during the manufacturing process. The detection of arsenic for product running through the manufacturing lines uses the effect of arsenic enhanced oxidation. That is, the high temperature oxidation anneal used to drive arsenic into the semiconductor substrate is monitored for thickness. For large levels of arsenic outdiffusion, the oxidation rate will increase resulting in a thicker oxide layer. If such an event is detected, the product that has been through the process steps to form the buried plate up to the drive-in anneal, can be reworked to reduce arsenic contamination. The rework procedure depends on the location of the product in the overall process flow. The advantage of the present application is that product functionality and yield is protected without scrapping the material.

In general terms, the present invention provides a method of forming a trench capacitor which includes:

providing a semiconductor substrate having at least one trench opening having an aspect ratio of greater than 3.0 located therein, said at least one trench opening having sidewalls that extend to a common bottom wall;

providing a recessed arsenic-containing film within a bottom portion of said at least one trench opening, while maintaining the sidewalls in an upper portion of the at least one trench opening essentially free of residual arsenic; and annealing, in an oxygen-containing ambient, to cause outdiffusion of arsenic from said recessed arsenic-containing film into said semiconductor substrate, wherein during said annealing oxide growth within the at least one trench opening is monitored.

In accordance with the present invention, the term "essentially free of residual arsenic" denotes that the sidewalls of the at least one trench opening in the upper portion thereof contain less than $5 \times 10^{16}$ atoms/cm$^3$ arsenic.

In accordance with the present invention, the monitoring is achieved by use of an oxide thickness monitor and the arsenic enhanced oxidation effect. If the oxide growth exceeds a predetermined level during this annealing step, steps are performed in the present invention to remove residual arsenic from the at least one opening. Included within the steps are resist apply, recess resist etch, oxide recess etch, and removal of residual arsenic.

The present invention contemplates two embodiments of the general method described above. The two embodiments will be described in greater detail herein below In addition to the general method described above, the present invention also provides a trench capacitor structure including:

a semiconductor substrate having at least one trench opening having an aspect ratio of greater than 3.0 located therein, said at least one trench opening having sidewalls that extend to a common bottom wall;

an arsenic-outdiffused buried plate located within said substrate around said common bottom wall of said at least one trench opening, said arsenic-outdiffused buried plate having an outdiffused thickness of about 200 nm or less;

a node dielectric within a lower portion of said at least one trench opening along said sidewalls and common bottom wall;

a collar region located on said sidewalls of said at least one trench opening above said node dielectric, said collar region located on a portion of the semiconductor substrate that is essentially free of arsenic contaminates; and a conductive material within said at least one opening.

The term "essentially free of arsenic contaminates" denotes that the semiconductor substrate abutting the collar region contains less than $5 \times 10^{-4}\%$ As.

DETAILED DESCRIPTION OF THE INVENTION

Figure 1A:
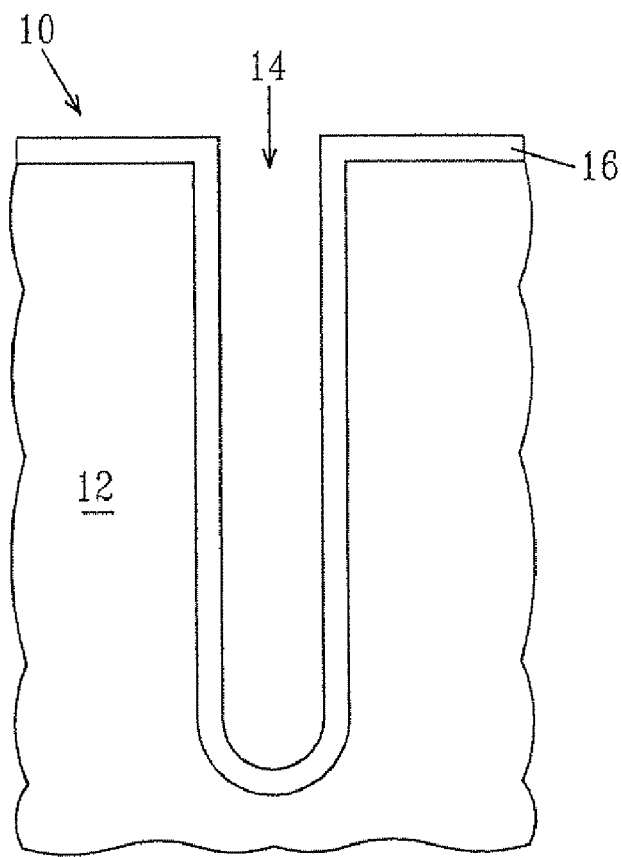
FIGS. 1A-1H are pictorial representations (through cross sectional views) depicting basic processing steps which are employed in the prior art in fabricating a portion of a trench capacitor.
Figure 1B:
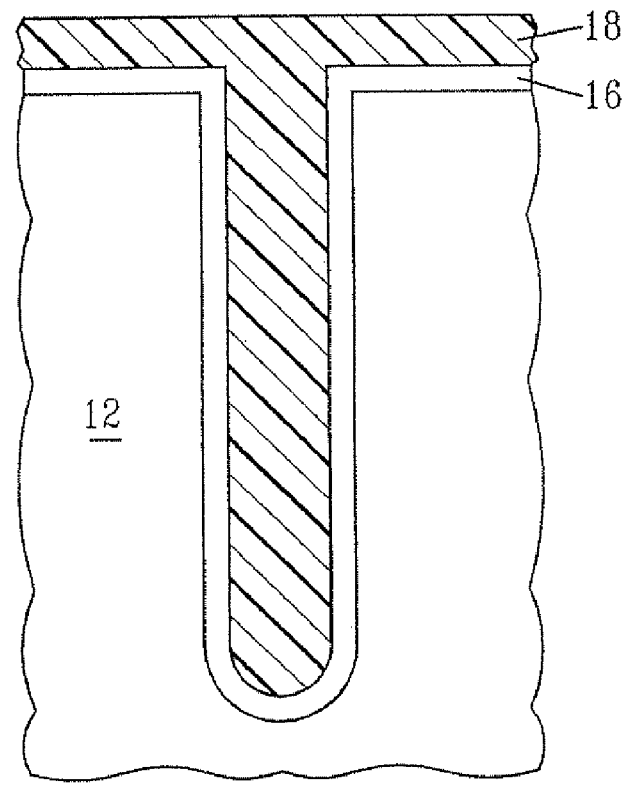
Figure 1C:
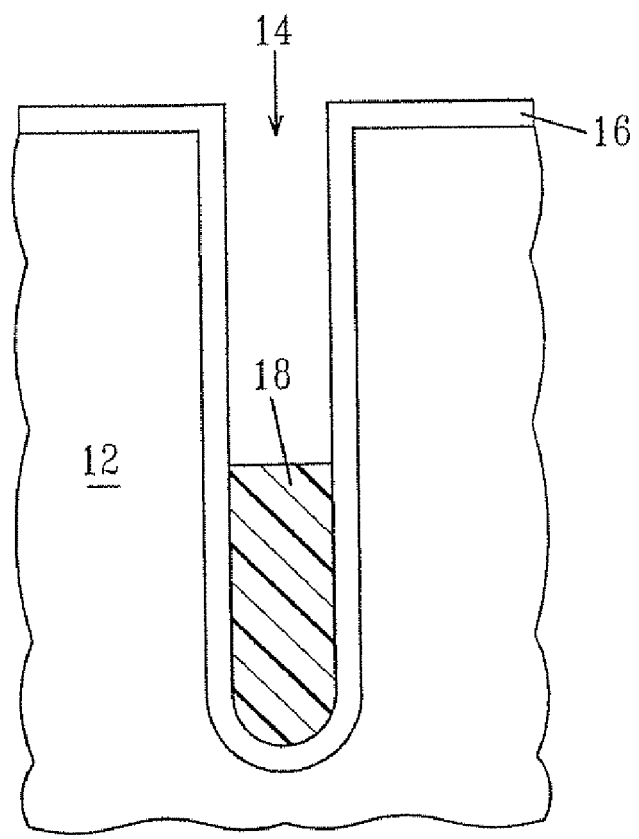
Figure 1D:
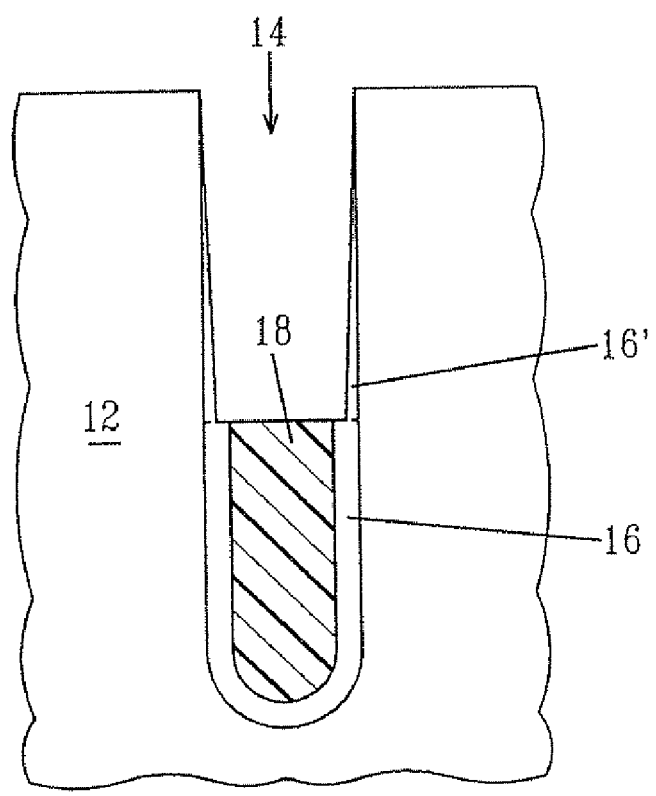
Figure 1E:
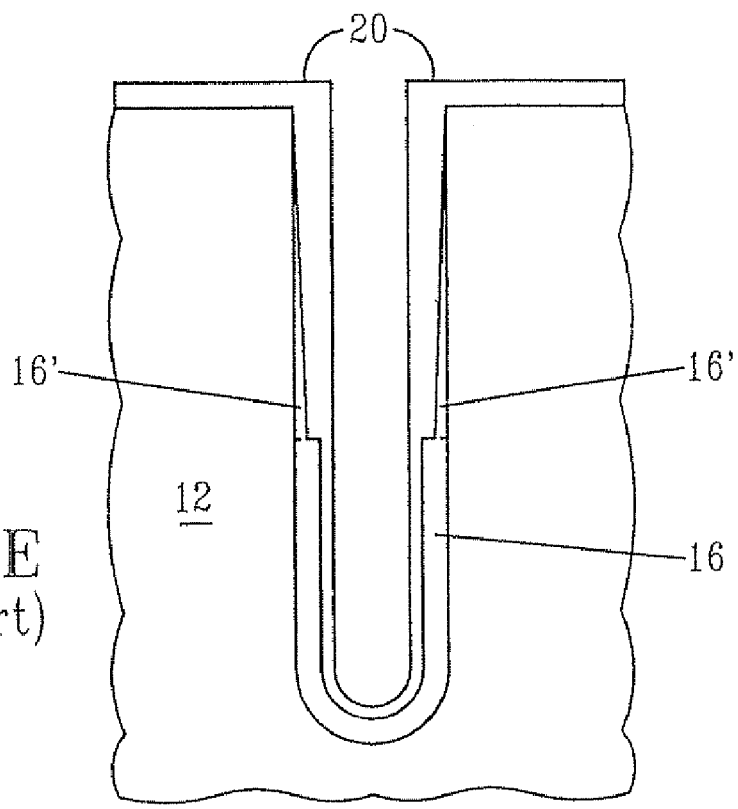
Figure 1F:
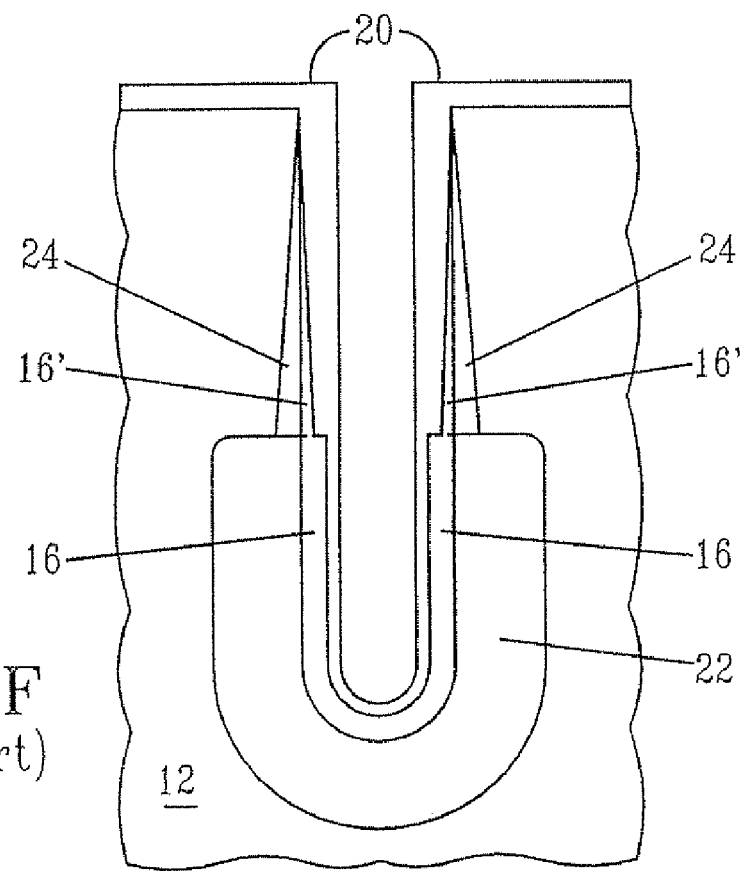
Figure 1G:
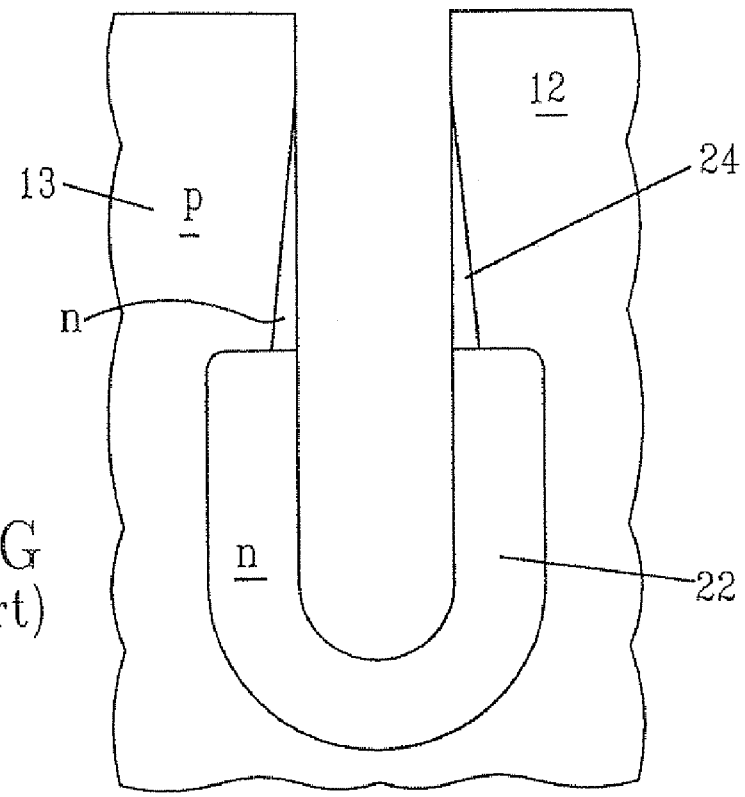
Figure 1H:
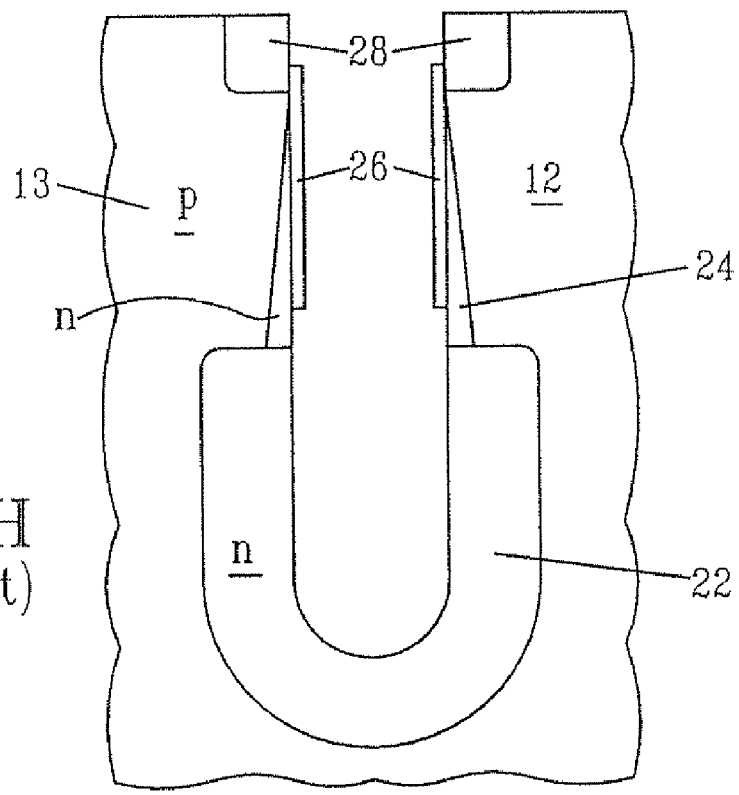

The present invention, which provides a method to substantially reduce or essentially eliminate arsenic contamination along sidewalls of a trench capacitor structure and the resultant trench capacitor structure formed thereby, will now be described in greater detail by referring to the following description and drawings that accompany the present application.

Reference is first made to FIGS. 2A-2I which are cross-sectional views of the inventive trench capacitor structure through a first embodiment of the present invention. The first embodiment of the present invention begins by fabricating the initial structure 50 shown in FIG. 2A. As illustrated, the initial structure 50 shown in FIG. 2A includes a semiconductor substrate 52 having at least one trench opening 54 (i.e., one or more trench openings) having a high aspect ratio located therein. The term "high aspect ratio" denotes the at least one trench opening 54 has a depth to width ratio of greater than 3.0, preferably greater than 5.0. The initial structure 50 also includes an arsenic-containing film 56 which is located within the at least one trench opening 54 and extending atop a surface of the semiconductor substrate 52.

The term "semiconductor substrate" is used throughout the present application to denote any material having semiconducting properties. Suitable examples of such semiconducting materials include, but are not limited to: Si, SiGe, SiC, SiGeC, Ge alloys, GaAs, InAs, InP as well as other III/A or II/VI compound semiconductors. The semiconductor substrate 52 may also comprise a layered semiconductor such as, for example, Si/SiGe, or a semiconductor-on-insulator. Typically, the semiconductor substrate 52 is a Si-containing semiconductor such as, for example, Si, SiGe, SiC, SiGeC, a silicon-on-inuslator or a SiGe-on-insulator. Preferably, the semiconductor substrate 52 is a silicon substrate.

The semiconductor substrate 52 can be in a crystalline, polycrystalline or amorphous form. The semiconductor substrate 52 may comprise a single crystal orientation or it may comprise surface regions that have different crystal orientations. The later substrates are referred to as hybrid orientation substrates (i.e., HOT substrates).

The semiconductor substrate 52 may be of the no or p-type depending on the type of device to be fabricated. Moreover, the substrate 52 may contain various isolation and/or device regions formed within the substrate 52 or disposed thereon. For clarity, these regions are not shown in the drawings, but are nevertheless meant to be included within region 52.

Next, at least one trench opening 54 having a high aspect ratio is then formed into the semiconductor substrate 52. The at least one trench opening 54 is formed utilizing standard techniques that are well known in the art. For example, an optional hardmask (not shown) can be first formed onto the surface of the substrate 52 utilizing a standard deposition process such as, for example, chemical vapor deposition (CVD), plasma enhanced chemical vapor deposition. (PECVD), sputtering, chemical solution deposition, evaporation or atomic layer deposition. Alternatively, the optional hardmask can be formed utilizing a thermal oxidation, nitridation or oxynitridation process. Combinations of these techniques are also contemplated herein. The optional hardmask, which is disposed on the surface of the semiconductor substrate 52, may be comprised of an oxide, nitride, oxynitride, silicate glass material or any combination thereof. Examples of hardmasks that can be employed in the present invention include, but are not limited to: ones that are comprised of silicon dioxide and/or silicon nitride. The thickness of the optional hardmask may vary depending, for example, on the technique used in forming the same and the number of material layers within the hardmask. Typically, the optional hardmask has a thickness from about 500 to about 3000 nm.

A photoresist mask, not shown, is then formed atop the surface of the optional hardmask (or atop substrate 52, when no hardmask is employed) utilizing a conventional deposition process and thereafter the photoresist mask is patterned utilizing conventional lithography which includes exposing the photoresist to a pattern of radiation, and developing the pattern into the exposed photoresist utilizing a conventional resist developer. After the photoresist has been patterned, the pattern is transfer into the optional hardmask and substrate 52 utilizing a conventional dry etching process such as reactive-ion etching, plasma-etching, ion beam etching, laser ablation or any combination thereof so as to form the at least one trench opening 54 in the substrate 52. The depth of the at least one trench opening 54, measured from the uppermost surface of substrate 52 is typically from about 0.1 to about 10 μm, with a depth of from about 5 to about 10 μm being more highly preferred. The width of the at least one trench opening 54 is typically from about 100 to about 500 nm, with a width from about 100 to about 400 nm being even more typical. It is noted that the above ranges provide at least one trench opening 54 that has a high aspect ratio.

Note that each of the trench openings 54 formed has vertical sidewalls that extend to a common bottom wall. The bottom wall may be curved as shown in the drawings, or it may be substantially horizontal.

Following the formation of the at least one trench opening 54, the photoresist is removed utilizing a conventional stripping process well known to those skilled in the art. At this point of the inventive process the optional hardmask is also removed utilizing a conventional wet chemical strip process such as hydrofluoric—sulphuric acid.

Next, an arsenic-containing film 56 is formed on the exposed surface of the substrate 52 including within the at least one trench opening 54. The arsenic-containing film 56 within the at least one trench opening 54 covers the bare sidewalls and the bottom wall of the at least one trench opening 54. The arsenic-containing film 56 is formed utilizing a conventional conformal deposition process such as, for example, chemical vapor deposition, plasma enhanced chemical vapor deposition, sputtering, atomic layer deposition, chemical solution deposition and the like. The arsenic-containing film 56 is typically an arsenic doped silicate glass (i.e., arsenic-doped silicate glass, ASG) or another like sacrificial dielectric material that includes arsenic in a sufficient concentration which is capable of forming a buried plate within the substrate 52 during a subsequent annealing step. The concentration of arsenic within the arsenic-containing film 56 may vary so long as the amount is sufficient to form a buried plate within the substrate. Typically, the arsenic-containing film 56 has an arsenic concentration from about $1 \times 10^{21}$ to about $2 \times 10^{22}$ atoms/cm$^3$, with a range from about $1 \times 10^{22}$ to about $1.5 \times 10^{22}$ being more typical.

The arsenic-containing film 56 is a continuous film whose thickness along the sidewalls and common bottom wall within the at least one trench opening 54 is typically uniform. By "uniform" it is meant that the thickness variation of the arsenic-containing film 56 is less than 4 nm. Typically, the arsenic-containing film 56 has a thickness from about 5 to about 40 nm, with a thickness from about 5 to about 30 nm being even more typical.

Figure 2A:
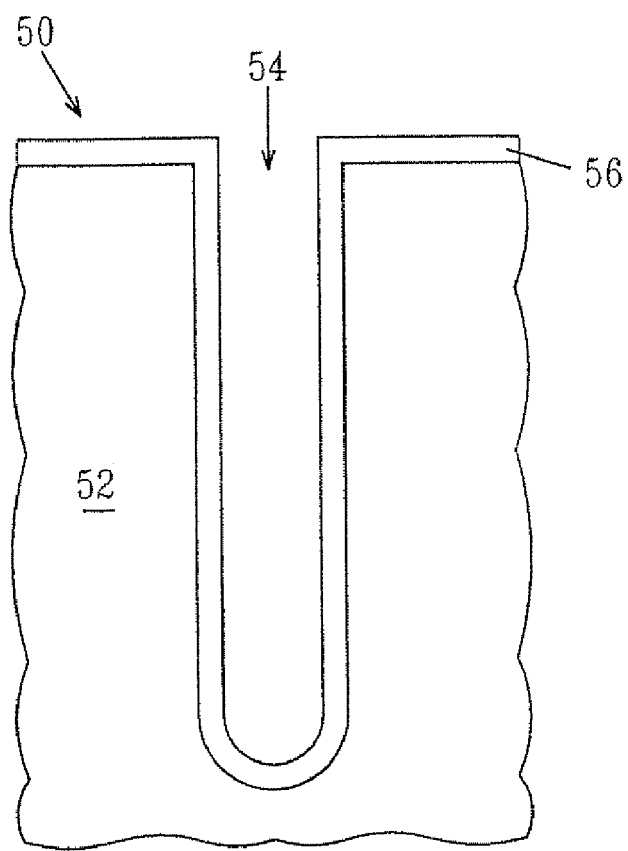
FIGS. 2A-2I are pictorial representations (through cross sectional views) depicting a method of the present invention in accordance with one embodiment thereof.
Figure 2B:
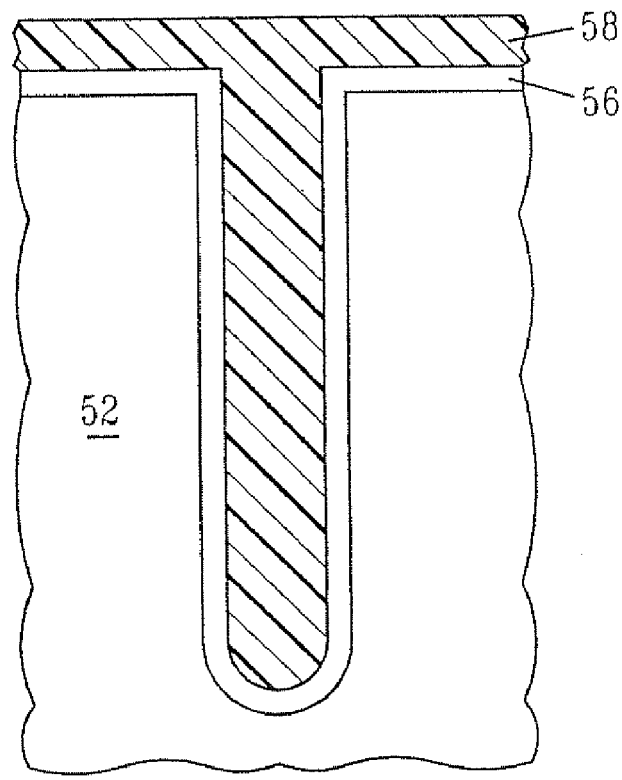

Next, and as shown in FIG. 2B, a first photoresist 58 is formed on the structure shown in FIG. 2A. As is illustrated, the photoresist 58 is formed within the at least one trench opening 54 atop of the previously formed arsenic-containing film 56 as well as atop the arsenic-containing film 56 that extends above the at least one trench opening 54. The photoresist 58 comprises any conventional photoresist or an anti-reflective coating material, and it is formed utilizing a conventional deposition process, including, for example, spin-on coating, CVD, and PECVD.

Figure 2C:
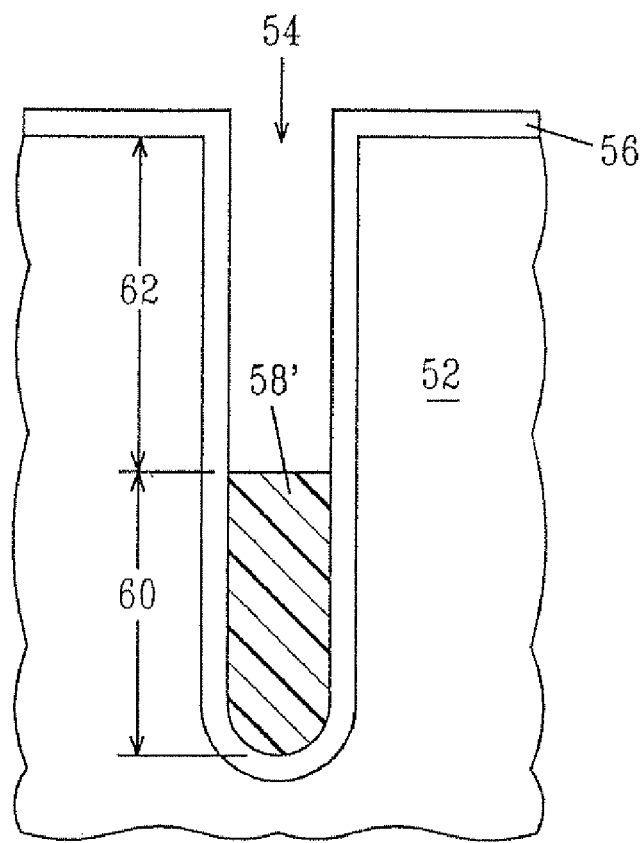

After forming the photoresist 58, the photoresist 58 is recessed utilizing an etching process such that a recessed photoresist 58' remains in a bottom portion 60 of the at least one trench opening 54. Typically, the photoresist 58 is recessed to a predetermined level (typically about 2 μm or less) beneath the upper surface of substrate 52. The resultant structure including the recessed photoresist 58' is shown in FIG. 2C. The etching process used in forming the structure shown in FIG. 2C comprises an etching process that is selective for removing the photoresist material from a top portion 62 of the at least one trench opening 54. Typically, the etching process is a timed reactive-ion etching process wherein the etch chemistry is selective in removing photoresist material.

Figure 2D:
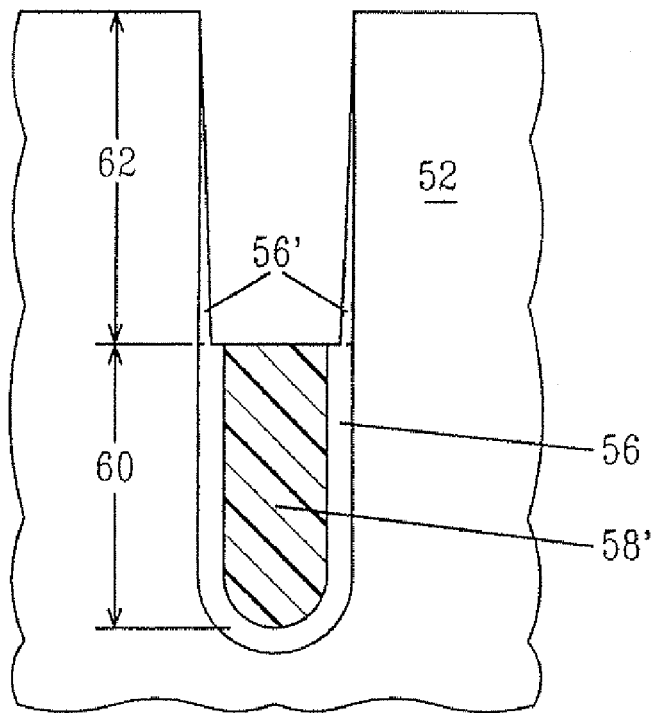

FIG. 2D illustrates the structure of FIG. 2C after the exposed arsenic-containing film 56 in the top portion 62 of the at least one trench opening 54 is recessed utilizing a conventional etching process that is selective in removing the arsenic-containing film 56 that is not protected by the recessed photoresist. Due to the etch chemistries and other variables, residual arsenic-containing film 56' remains on the sidewalls of the at least one trench opening 54 in the top portion 62 thereof. As is illustrated, the thickness of the residual arsenic-containing film 56' tends to be less the further it gets from the arsenic-containing film 56 in the bottom portion 60 of the at least one trench opening 54.

After recessing the arsenic-containing film 56, the recessed photoresist 58' is removed from the bottom portion 60 of the at least one trench opening 54 utilizing a conventional stripping process that is well known to those skilled in the art. After stripping the recessed photoresist 58' from the at least one trench opening 54, the arsenic-containing film 56 and the residual arsenic-containing film 56' are both exposed.

Figure 2E:
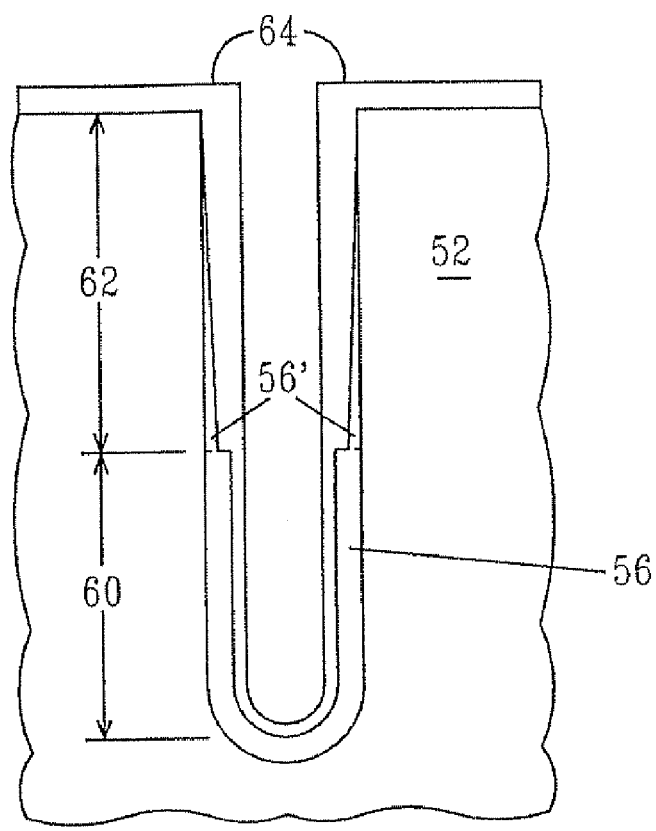
Figure 2F:
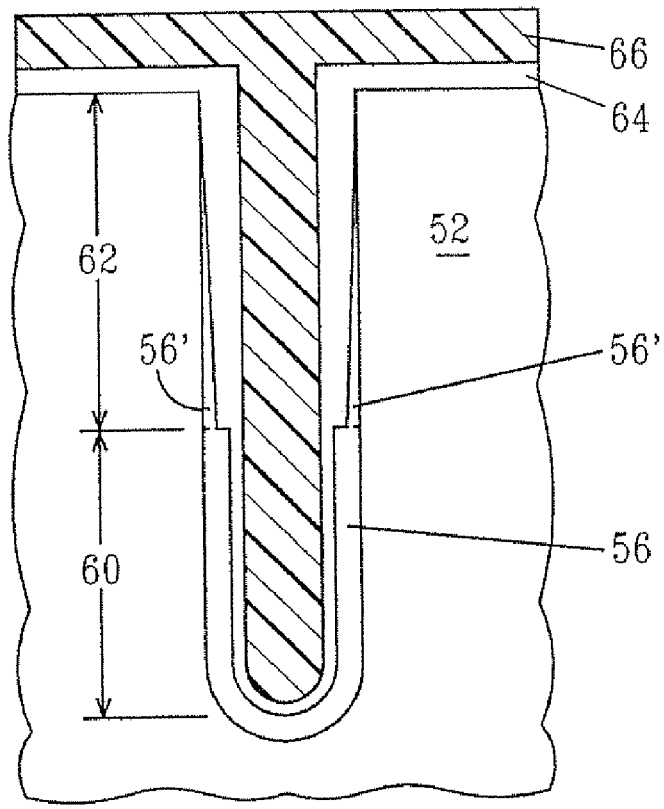

FIG. 2E illustrates the structure after a first dielectric cap 64 is formed. As shown, the dielectric cap 64 is formed within the at least one trench opening 54 on the exposed surfaces of the arsenic-containing film 56 and residual the arsenic-containing film 56'. The dielectric cap 64 is comprised of an oxide, nitride, oxynitride, or any combination thereof, with oxide dielectrics being high preferred. The dielectric cap 64 is formed utilizing a conventional deposition process such as, for example, CVD, PECVD, evaporation or chemical solution deposition. The dielectric cap 64 has a uniform thickness (with little or no thickness variation) from about 10 to about 100 nm, with a thickness from about 30 to about 90 nm being highly preferred.

After forming the dielectric cap 64, a second photoresist 66 is formed filling the at least one trench opening 54 and extending atop the dielectric cap 64 that was previously formed atop the substrate 52. The second photoresist 66 is formed utilizing the same or different deposition process as the first photoresist 58 and it comprises a same or different photoresist material as that of the first photoresist 58. The resultant structure including the second photoresist 66 is shown, for example, in FIG. 2F.

Figure 2G:
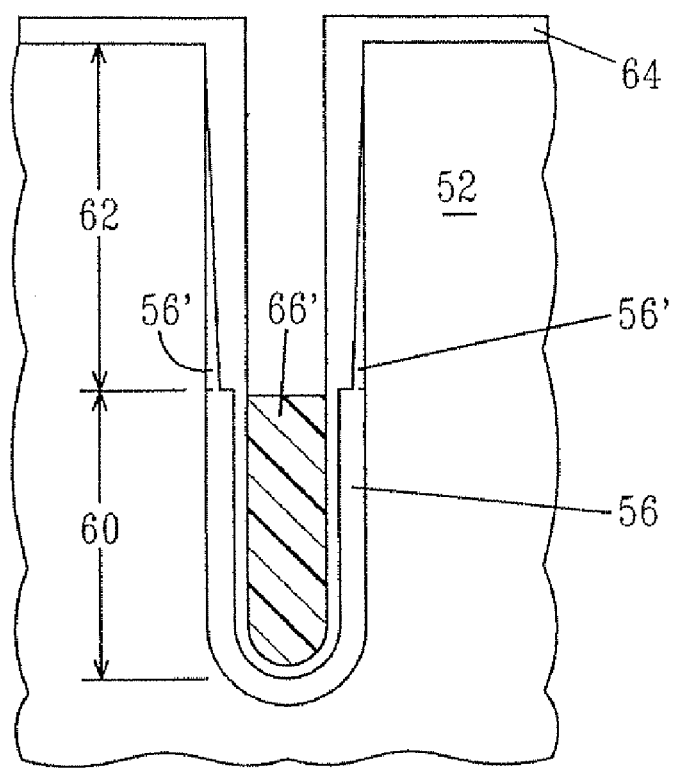
Figure 2H:
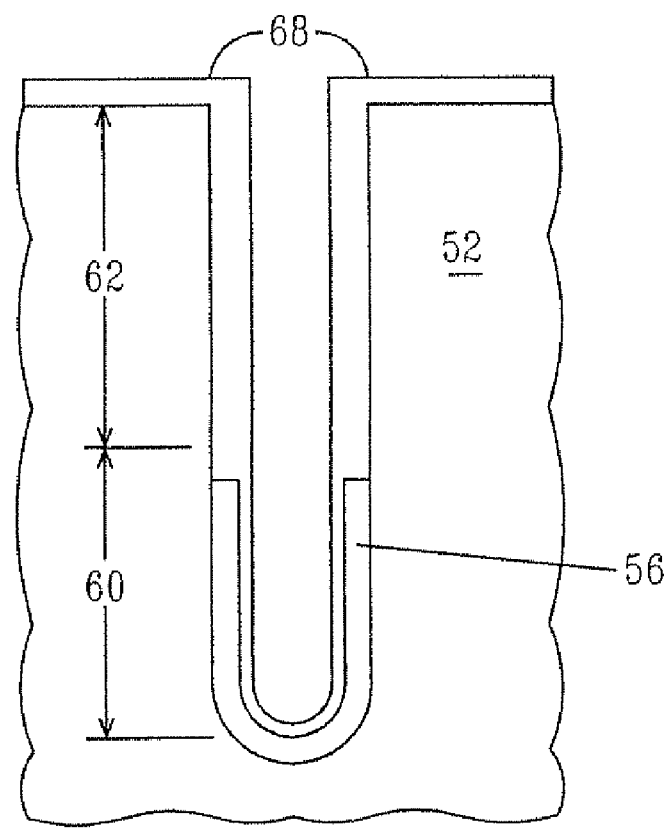
Figure 2I:
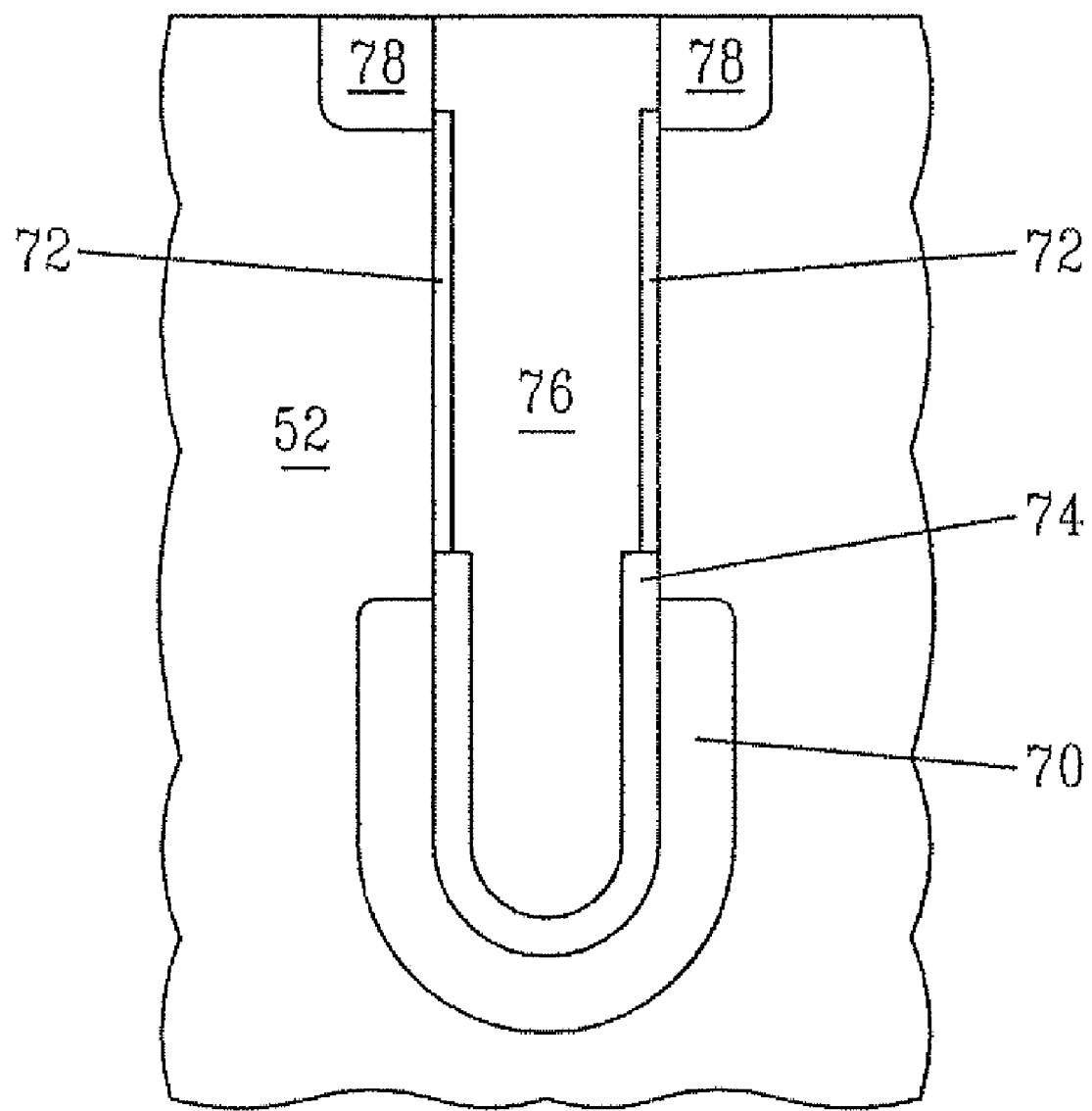

FIG. 2G shows the structure after the second photoresist 66 has been recessed forming a recessed second photoresist 66' within the bottom portion 60 of the at least one trench opening 54. The recessing of the second photoresist 66 is performed utilizing an etching process as described above for recessing the first photoresist 58. The recessed second photoresist 66' has a height that is substantially the same as that of the remaining arsenic-containing film 56 within the bottom portion 60 of the at least one trench opening 54.

Next, the exposed dielectric cap 64 within the upper portion 62 of the at least one trench opening 54 is removed utilizing an etching process that selectively removes that dielectric material. During this etching process, the residual arsenic-containing film 56' is also removed such that bare semiconductor sidewalls are present in the upper portion 62 of the at least one trench opening 54. The etching process performed at this point of the present invention typically comprises a reactive-ion etching process where the etch chemistries are selective in removing dielectric material. After providing the bare sidewalls within the upper portion 62 of the at least one trench opening 54, the recessed second photoresist 66' is stripped utilizing a conventional removal process which exposes the underlying dielectric cap 64 in the bottom portion 60 of the at least one trench opening 54. This 'remaining' dielectric cap 64 may optionally be removed utilizing an etching process selective for removing the dielectric material, or it can remain in the trench opening. The former is shown in the drawings of the present invention. A second dielectric cap 68 is the formed providing the structure shown, for example, in FIG. 2H. It is noted that during the various etching processes mentioned in providing the structure shown in FIG. 2H, the arsenic-containing film 56 can be recessed further down within the at least one trench opening 54.

At this point of the present invention, arsenic from the remaining arsenic-containing film 56 is outdiffused into the semiconductor substrate 52 forming a buried plate region 70 that is doped with arsenic. The buried plate region 70 has an arsenic dopant concentration from about $1\times10^{18}$ to about $1\times10^{19}$ atoms/cm$^3$, with a dopant concentration from about $5\times10^{18}$ to about $1\times10^{19}$ atoms/cm$^3$ being more typical. Additionally, the buried plate region 70 has a diffusion thickness that is less than 200 nm. The outdiffusion is performed utilizing an annealing step in which an oxygen-containing ambient such as $O_2$, NO, ozone or the like is used. The annealing step is performed at a temperature of about 800° C. or greater.

After the anneal step, the second dielectric cap 68 is selectively recessed utilizing conventional processing from the least one trench opening 54. The arsenic-containing film 56 is then removed utilizing a conventional stripping process and thereafter the node dielectric 74, a conductive material 76, and a collar 72 are formed utilizing conventional techniques providing the structure shown, for example, in FIG. 2I. The node dielectric 74 is comprised of any conventional dielectric material including for example, oxides, nitrides, oxynitrides or combinations thereof. Typically, the node dielectric 74 is an oxide such as, for example, $SiO_2$, $Al_2O_3$, $Ta_2O_5$, $HfO_2$, $La_2O_3$, perovskite type oxides, or any combination thereof, including multilayers. Conductive material 76 is typically comprised of doped polysilicon, doped SiGe, a conductive metal, a conductive metal nitride, a conductive metal silicide, or any combination thereof. It is noted that in FIG. 2I, diffusion regions 78 are shown in the substrate adjacent the upper portion 62 of the at least one trench opening 54. The collar 72 may comprise an oxide or nitride, with oxides being highly preferred. The diffusion regions 78 are form utilizing conventional processing well known to those skilled in the art.

Further processing steps to form a MOSFET, which are well known to those skilled in the art, can now be performed in providing a DRAM cell.

Figure 3A:
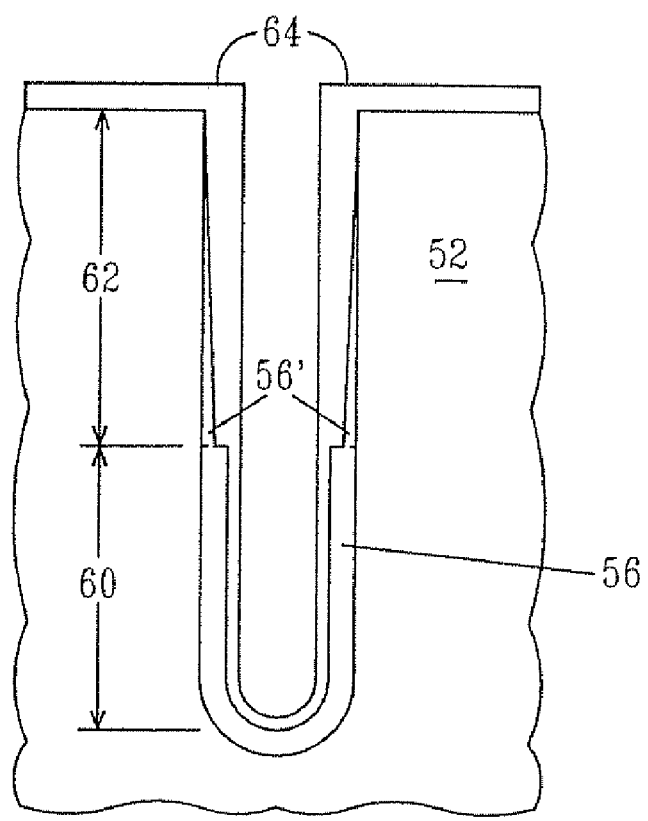
FIGS. 3A-3E are pictorial representations (through cross sectional views) depicting a method of the present invention in accordance with another embodiment thereof.
Figure 3B:
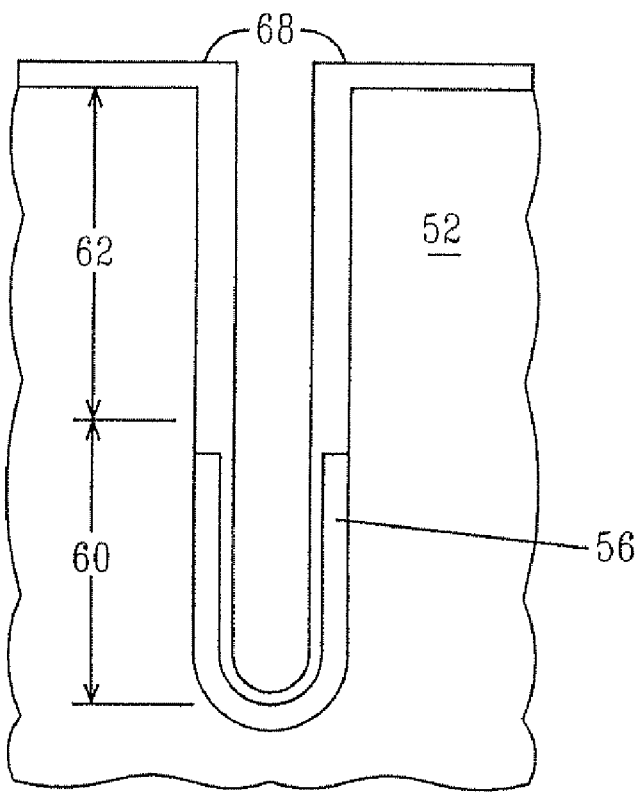

Reference is now made to FIGS. 3A-3E which illustrate the inventive structure through a second embodiment of the present invention. The second embodiment of the present invention begins by first providing the structure shown in FIG. 3A. It is noted that this structure shown in FIG. 3A is the same as that shown in FIG. 2E and, as such, the processing steps described above in forming the structure shown in FIG. 2E are also used herein in forming the structure shown in FIG. 3A.

Next, the dielectric cap 64 and the residual arsenic-containing film 56' are removed from the structure utilizing an etching process that selectively removes these materials. During this step, the remaining arsenic-containing film 56 is recessed further down within the at least one trench opening 54 and typically it is thinned during these processing steps. A second dielectric cap 68 is then formed as described above providing the structure shown, for example, in FIG. 3B.

With the second dielectric cap 68 in place, the above described annealing process is performed which causes outdiffusion of arsenic from the arsenic-containing film 56 into the substrate 52 forming buried plate region 70. The buried plate region 70 formed during this step of the present invention has a lower arsenic concentration than that of the buried plate region 70 formed in the first embodiment of the present invention. Typically, the buried plate region 70 formed in the second embodiment of the present invention has an arsenic concentration of less than $9\times10^{18}$ atoms/cm$^3$. The thickness of the outdiffusion in this second embodiment is less than that of the first embodiment. Typically, and for the second embodiment, the buried plate region 70 has an outdiffused thickness of about 100 nm or less. The resultant structure, including the buried plate region 70 is shown, for example, in FIG. 3C.

Figure 3C:
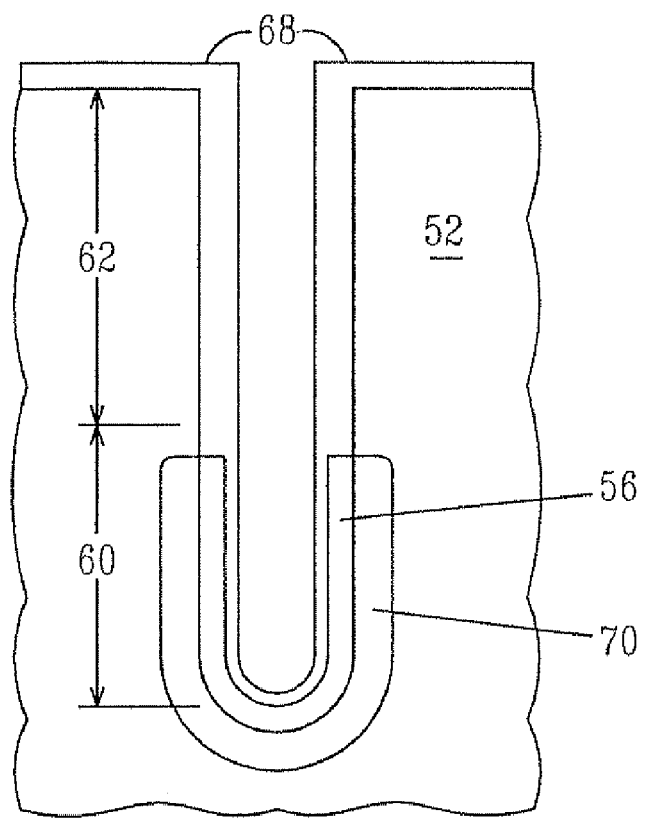
Figure 3D:
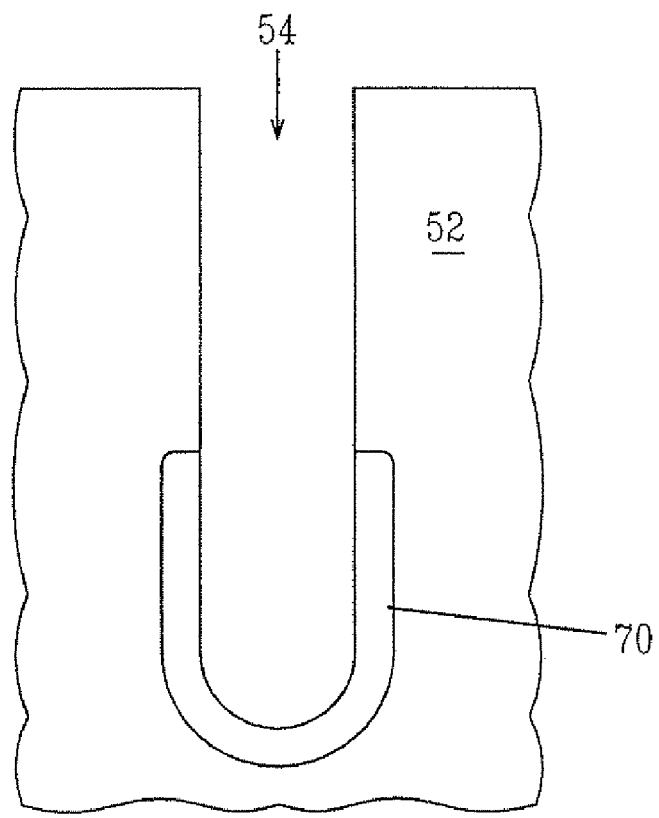

FIG. 3D shows the structure of FIG. 3C after stripping the second dielectric cap 68 and stripping the remaining arsenic-containing film 56. These steps of the present invention are the same as that discussed above for the first embodiment.

Figure 3E:
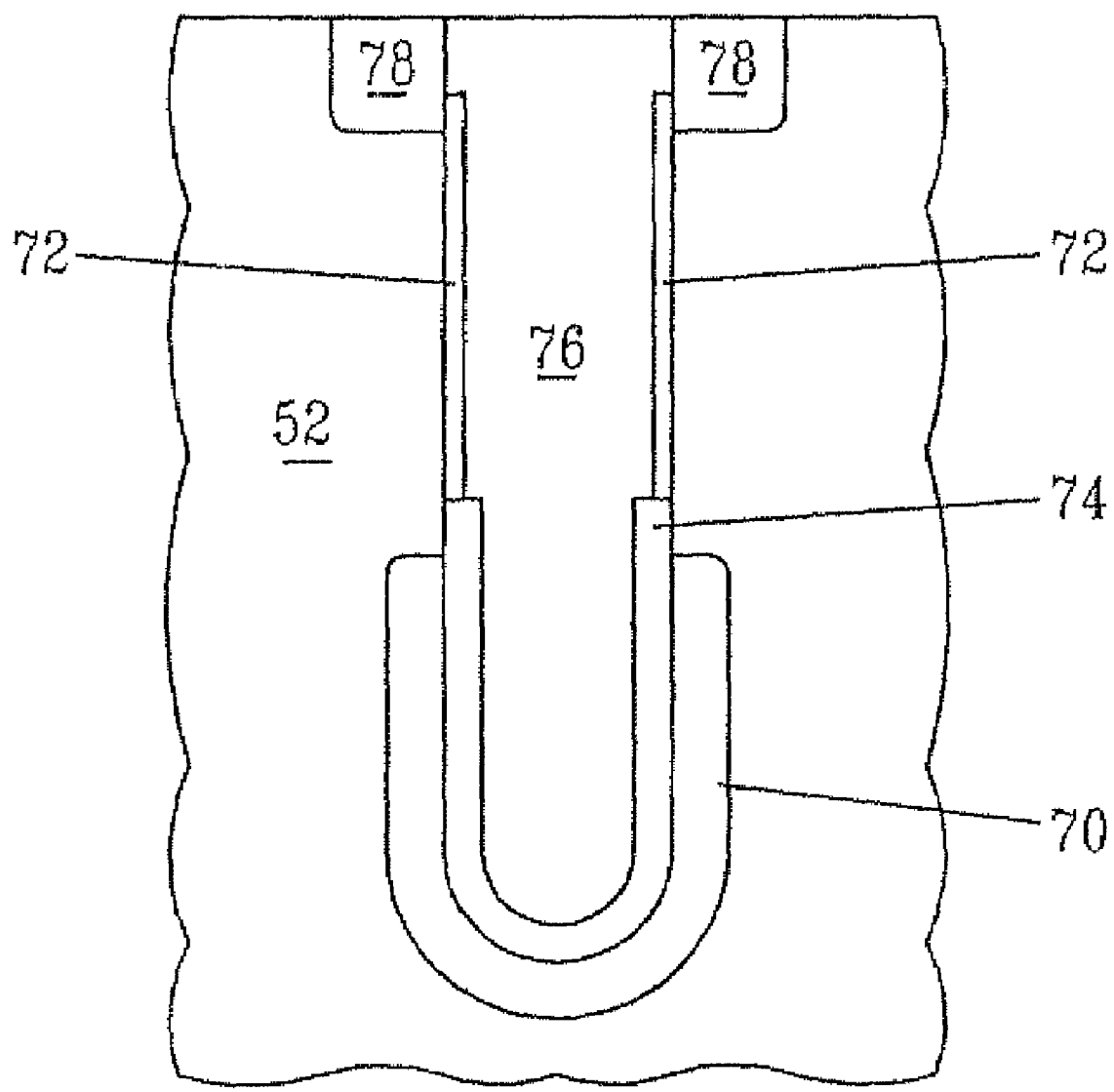

FIG. 3E illustrates the structure after formation of the node dielectric 74, a conductive material 76, collar 72 and diffusion regions 78. These elements and regions are formed utilizing conventional techniques that are well known in the art.

It is submitted that the various processing embodiments mentioned above, provide a trench capacitor structure in which the arsenic outdiffusion into the sidewalls of the trench opening in the upper portion thereof that abuts the collar is substantially reduced or essentially eliminated. Thus, the concentration of arsenic that would be present in the array well is low (on the order of less than $5 \times 10^{16}$ atoms/cm$^3$). At such low arsenic levels, the functionality of the device is not negatively impacted.

It is further noted that that during the drive-in anneal mentioned above, the present invention detects the arsenic contamination and provides means for eliminating the same therefrom. In particular, the high temperature oxidation anneal used to drive arsenic into the semiconductor substrate is monitored for thickness. For large levels of arsenic outdiffusion, the oxidation rate will increase resulting in a thicker oxide layer. If such an event is detected, the product that has been through the process steps to form the buried plate up to the drive-in anneal, can be reworked to reduce arsenic contamination. The rework procedure depends on the location of the product in the overall process flow. The advantage of the present application is that product functionality and yield is protected without scrapping the material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A trench capacitor structure including:
   a semiconductor substrate having at least one trench opening having an aspect ratio of greater than 3.0 located therein, said at least one trench opening having sidewalls that extend to a common bottom wall;
   an arsenic-outdiffused buried plate located within said substrate around said common bottom wall of said at least one trench opening, said arsenic-outdiffused buried plate having an outdiffused thickness of about 200 nm or less;
   a node dielectric within a lower portion of said at least one trench opening along said sidewalls and common bottom wall;
   a collar region located on said sidewalls of said at least one trench opening above said node dielectric, said collar region located on a portion of the semiconductor substrate that is essentially free of arsenic contaminates; and
   a conductive material within said at least one opening.

2. The trench capacitor structure of claim 1 wherein said semiconductor substrate comprises one of Si, SiGe, SiC, SiGeC, Ge alloys, GaAs, InAs, InP, Si/SiGe or semiconductor-on-insulators.

3. The trench capacitor structure of claim 2 wherein said semiconductor substrate is Si-containing.

4. The trench capacitor structure of claim 1 wherein said aspect ratio is greater than 5.

5. The trench capacitor structure of claim 1 wherein said arsenic-outdiffused buried plate has an arsenic concentration from about $1 \times 10^{18}$ to about $1 \times 10^{19}$ atoms/cm$^3$.

6. The trench capacitor structure of claim 1 wherein said arsenic-outdiffused buried plate has an arsenic concentration of less than about $9 \times 10^{18}$ atoms/cm$^3$.

7. The trench capacitor structure of claim 1 wherein said node dielectric is an oxide.

8. The trench capacitor structure of claim 1 wherein said collar is an oxide or nitride.

9. The trench capacitor structure of claim 1 wherein said conductive material is doped polysilicon, doped SiGe, a conductive metal, a conductive metal nitride, a conductive metal silicide or combinations and multilayers thereof.

* * * * *